US008865491B2

(12) United States Patent
Tomikawa

(10) Patent No.: US 8,865,491 B2
(45) Date of Patent: Oct. 21, 2014

(54) METHOD FOR PRODUCING ELECTRO-OPTICAL DEVICE AND SUBSTRATE FOR ELECTRO-OPTICAL DEVICE

(71) Applicant: Seiko Epson Corporation, Tokyo (JP)

(72) Inventor: Naoki Tomikawa, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/886,508

(22) Filed: May 3, 2013

(65) Prior Publication Data

US 2013/0302921 A1 Nov. 14, 2013

(30) Foreign Application Priority Data

May 9, 2012 (JP) ................................. 2012-107354

(51) Int. Cl.
*H01L 21/00* (2006.01)
*H01L 33/48* (2010.01)
*H01L 27/32* (2006.01)

(52) U.S. Cl.
CPC ............... *H01L 33/48* (2013.01); *H01L 27/32* (2013.01)
USPC ........................................................ 438/28

(58) Field of Classification Search
CPC ....... H01L 33/48; H01L 33/005; H01L 33/08; H01L 27/12; H01L 33/16; H01L 21/336; H01L 21/02; H01L 51/00
USPC ................... 438/26–28; 257/59, 88, 72, 303, 257/347–357, 431, 532, 452, E27.111, 257/E33.056; 349/96, 144–158, 110, 167, 349/187–190, 116, 61, 29–48; 345/205, 87, 345/208, 102
See application file for complete search history.

(56) References Cited

U.S. PATENT DOCUMENTS

| 6,229,510 | B1 * | 5/2001 | Kim et al. ........................ 345/87 |
| 6,803,976 | B1 | 10/2004 | Fujioka et al. |
| 8,081,153 | B2 | 12/2011 | Shirasaka et al. |
| 2005/0112408 | A1 * | 5/2005 | Kobayashi et al. ........... 428/690 |
| 2007/0040983 | A1 * | 2/2007 | Ishii .............................. 349/152 |
| 2007/0170861 | A1 * | 7/2007 | Lee et al. ....................... 313/512 |
| 2008/0055529 | A1 * | 3/2008 | Shirasaka et al. ............. 349/143 |
| 2012/0319123 | A1 * | 12/2012 | Han et al. ......................... 257/72 |

FOREIGN PATENT DOCUMENTS

| JP | 2000-221521 A | 8/2000 |
| JP | 2000-338510 A | 12/2000 |
| JP | 2002-196355 A | 7/2002 |
| JP | 2008-020725 A | 1/2008 |
| JP | 2008-058497 A | 3/2008 |
| JP | 2010-026032 A | 2/2010 |

* cited by examiner

*Primary Examiner* — Yuanda Zhang
*Assistant Examiner* — Sheikh Maruf
(74) *Attorney, Agent, or Firm* — ALG Intellectual Property, LLC

(57) ABSTRACT

Disclosed is a method for producing an electro-optical device, which includes a step of defining sealing materials on either an element substrate side of a mother substrate or an opposing substrate side of the mother substrate, a step of supplying liquid crystal inside the sealing materials, a step of bonding the element substrate side of the mother substrate and the opposing substrate side of the mother substrate together, and a step of hardening the sealing materials in order to apply a predetermined potential to a peripheral electrode provided between a pixel region and sealing materials in at least a portion of the steps.

9 Claims, 10 Drawing Sheets

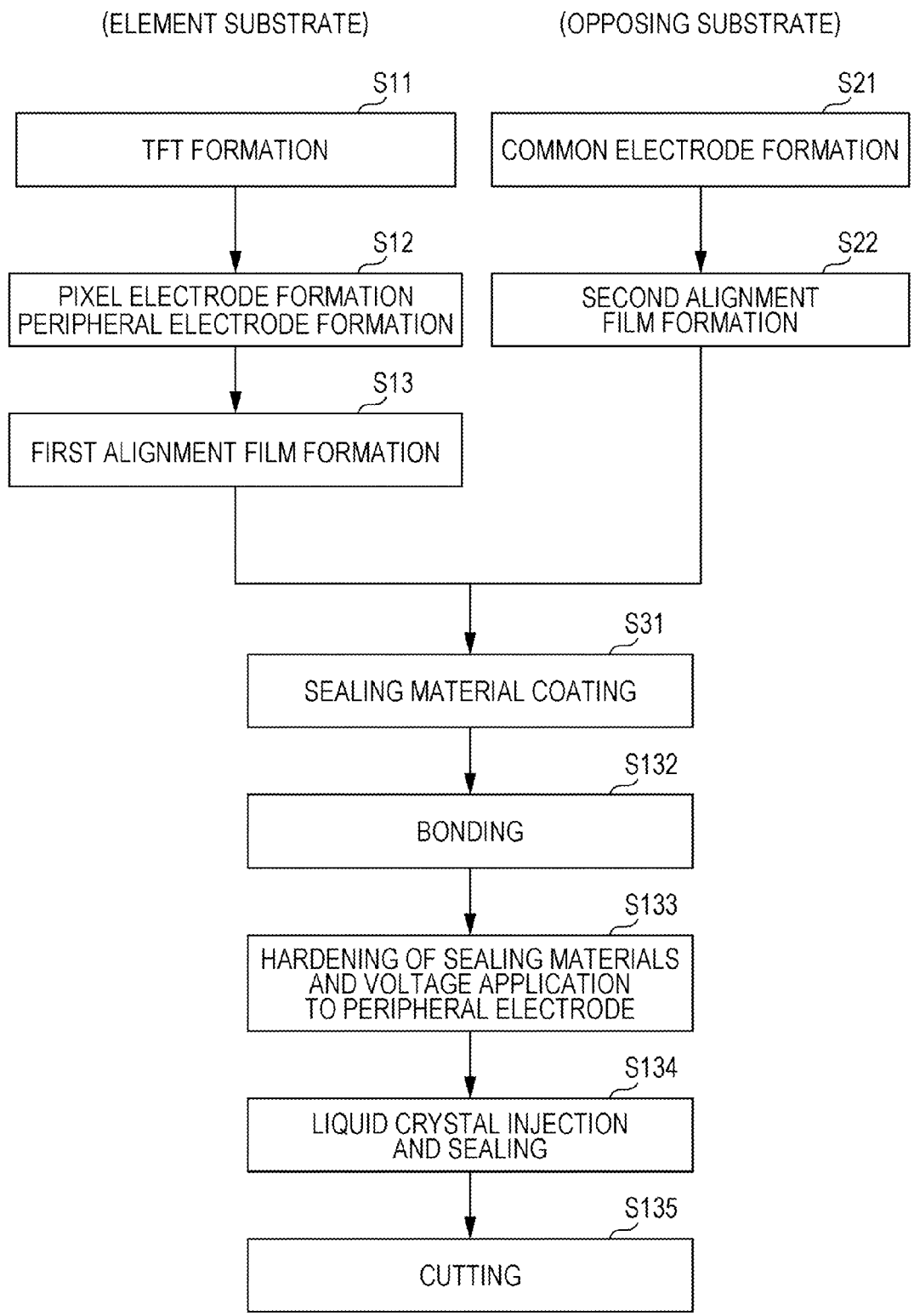

METHOD FOR PRODUCING ELECTRO-OPTICAL DEVICE AND SUBSTRATE FOR ELECTRO-OPTICAL DEVICE

BACKGROUND

1. Technical Field

The present invention relates to a method for producing an electro-optical device and a substrate for an electro-optical device.

2. Related Art

As electro-optical devices that are formed from substrates for an electro-optical device, for example, active drive type liquid crystal devices that are provided with a transistor for each pixel as an element that performs switching control of pixel electrodes are known. Liquid crystal devices are used, for example, in direct view displays, light bulb displays and the like.

Liquid crystal devices are configured from a liquid crystal layer being sandwiched between a pair of substrates that are bonded together through a sealing material. In liquid crystal devices, deteriorations in display properties, which result from impurities that are included in the liquid crystal of the liquid crystal layer (ionic impurities and the like) and impurities that are brought in together with the liquid crystal, or impurities that are eluted as a result of unhardened or hardened sealing material coming into contact with the liquid crystal, have been known.

In order solve such problems, in JP-A-2000-221521 and JP-A-2008-58497 for example, methods that suppress the spread of impurities into a liquid crystal layer (effective pixel region) by providing an electrode for ion trapping in a liquid crystal device are disclosed.

However, in the method disclosed in JP-A-2000-221521, since an electrode is provided in the vicinity of a liquid crystal injection inlet for preventing the spread of impurities that seep out from a sealing material, and this electrode cannot be applied to liquid crystal devices (for example, liquid crystal devices made using a One Drop Fill (ODF) method) that have impurities that are eluted after hardening of the sealing material or the like or processes of methods other than an injection method, it is necessary to inject liquid crystal into one liquid crystal device at a time and there is a problem that the productivity is low.

In addition, in the method disclosed in JP-A-2008-58497, a voltage is applied to an electrode for ion trapping when the liquid crystal device is driven, and there is a problem that it is not possible to prevent the spread of impurities at the time of enclosing the liquid crystal in the production process.

SUMMARY

The invention can be realized in the following forms or application examples.

Application Example 1

According to Application Example 1, there is provided a method for producing an electro-optical device including a first step of forming a plurality of sealing materials in a frame shape to surround each display region on at least one side of a first substrate, which includes a terminal, wiring that is electrically connected to the terminal and a peripheral electrode that is provided between a display region in each of a plurality of electro-optical devices that are electrically connected to the wiring and sealing materials, and a second substrate that is disposed facing the first substrate, a second step of applying an electro-optical substance to each region that is encompassed by the plurality of sealing materials, a third step of bonding the first substrate and the second substrate together, and a fourth step of hardening the sealing materials, and a predetermined potential is applied to the terminal in a portion of the processes from the first step to the third step.

In this case, since a voltage is applied in a portion of the steps from the first step of forming the sealing materials to the third step of bonding the substrates together, it is even possible to suppress the spread of impurities to an effective pixel region as a result of the peripheral electrode in a case in which impurities are included in the electro-optical substance that is dripped into the area surrounded by the sealing materials or impurities are brought in together with the electro-optical substance. As a result of this, it is possible to suppress the generation of display defects such as burn-in and display unevenness. In addition, since a plurality of electro-optical devices are imposed on the first substrate (second substrate), a voltage is applied to the terminal that is connected to the peripheral electrode formed in each of the plurality of electro-optical devices and the electro-optical devices are configured collectively such that impurities do not spread, it is possible to enclose liquid crystal between a pair of substrates while suppressing the spread of impurities in a large (mother substrate) state. As a result of this, it is possible to improve productivity.

Application Example 2

In the method for producing an electro-optical device according to Application Example 1, it is preferable that the peripheral electrode be provided with a first peripheral electrode that is disposed on a display region side and a second peripheral electrode that is disposed outside the first peripheral electrode, and that different potentials be applied to the first peripheral electrode and the second peripheral electrode.

In this case, it is possible to create a transverse electric field by forming the first peripheral electrode and the second peripheral electrode to which different potentials are applied in the outer periphery of the display region. Accordingly, it is possible to suppress the spread of ionic impurities from the sealing materials which are exuded as a result of coming into contact with liquid crystal, to the display region side. Moreover, in comparison with a method of a vertical electric field that applies different potentials between a peripheral electrode and a common electrode on the second substrate side, the transverse electric field can further prevent the spread of ionic impurities.

Application Example 3

In the method for producing an electro-optical device according to Application Example 1 or 2, it is preferable that a step of forming an alignment film in the first substrate and the second substrate be included, and the alignment film be an inorganic oblique deposition film.

In this case, since a peripheral electrode for ion trapping is formed at the perimeter of the display region, it is even possible to suppress the spread of ionic impurities to the display region which has an inorganic oblique deposition film in a case in which the affinity of the impurities (ionic impurities) and the inorganic oblique deposition film is high. Accordingly, it is possible to suppress deteriorations in image quality such as display unevenness.

Application Example 4

In the method for producing an electro-optical device according to any one of Application Examples 1 to 3, it is preferable that a step of forming a pixel electrode in the first substrate be included, and the sealing materials be formed on the first substrate.

In this case, since the pixel electrode, the peripheral electrode and the sealing materials are formed on the first substrate, it is possible to form the peripheral electrode without adding new production steps. More specifically, it is possible to create the peripheral electrode using a photolithography step that is used while forming the pixel electrode. Accordingly, it is possible to suppress the cost and production requirements thereof.

Application Example 5

According to Application Example 5, there is provided a method for producing an electro-optical device which forms a plurality of electro-optical devices by forming a plurality of sealing materials, which surround display regions of a plurality of electro-optical devices and a portion of which are open, on a first substrate, bonding the first substrate together with a plurality of second substrates and thereafter, injecting an electro-optical substance into the area surrounded by the sealing materials according to the present application example, the method including an eleventh step of forming a first substrate that has a peripheral electrode that is provided between a display region in each of a plurality of electro-optical devices and the sealing materials, wiring that is electrically connected to the plurality of peripheral electrodes, and a terminal that is electrically connected to the wiring, a twelfth step of forming a second substrate, a thirteenth step of forming sealing materials that have injection inlets for injecting the electro-optical substance, a fourteenth step of bonding the first substrate and the second substrate, a fifteenth step of hardening the sealing materials, and a sixteenth step of injecting the electro-optical substance inside each of the plurality of sealing materials, and a voltage is applied to the terminal in a portion of the processes from the fifteenth step to the sixteenth step.

In this case, since a voltage is applied to the peripheral electrode in at least the fifteenth step or the sixteenth step, it is even possible to suppress the spread of impurities to an effective pixel region as a result of the peripheral electrode in a case in which impurities are included in the electro-optical substance injected into the area surrounded by the sealing materials or impurities are brought in together with the electro-optical substance. In addition, since a plurality of electro-optical devices are imposed on the first substrate (second substrate), a voltage is applied to the terminal that is connected to the peripheral electrode formed in each of the plurality of electro-optical devices and the devices are configured such that impurities do not spread, it is possible to enclose liquid crystal between a pair of substrates while suppressing the spread of impurities in a large (mother substrate) state. As a result of this, it is possible to improve productivity.

Application Example 6

In the method for producing an electro-optical device according to Application Example 5, it is preferable that the peripheral electrode be provided with a first peripheral electrode that is disposed on a display region side and a second peripheral electrode that is disposed outside the first peripheral electrode, and that different potentials be applied to the first peripheral electrode and the second peripheral electrode.

In this case, it is possible to create a transverse electric field by forming the first peripheral electrode and the second peripheral electrode to which different potentials are applied in the outer periphery of the display region. Accordingly, it is possible to suppress the spread of ionic impurities from the sealing materials which are exuded as a result of coming into contact with liquid crystal, to the display region side. Moreover, in comparison with a method of a vertical electric field that applies different potentials between a peripheral electrode and a common electrode on the second substrate side, the transverse electric field can further prevent the spread of ionic impurities.

Application Example 7

In the method for producing an electro-optical device according to Application Example 5 or 6, it is preferable that a step of forming an alignment film in the first substrate and the second substrate be included, and the alignment film be an inorganic oblique deposition film.

In this case, since a peripheral electrode for ion trapping is formed at the perimeter of the display region, it is even possible to suppress the spread of ionic impurities to the display region which has an inorganic oblique deposition film in a case in which the affinity of the impurities (ionic impurities) and the inorganic oblique deposition film is high. Accordingly, it is possible to suppress deteriorations in image quality such as display unevenness.

Application Example 8

In the method for producing an electro-optical device according to any one of Application Examples 1 to 3, it is preferable that a step of forming a pixel electrode in the first substrate be included, and the sealing materials be formed on the first substrate.

In this case, since the pixel electrode, the peripheral electrode and the sealing materials are formed on the first substrate, it is possible to form the peripheral electrode without adding new production steps. More specifically, it is possible to create the peripheral electrode using a photolithography step that is used while forming the pixel electrode. Accordingly, it is possible to suppress the cost and production requirements thereof.

Application Example 9

According to Application Example 9, there is provided a substrate for an electro-optical device including a sealing section that is defined in frame form to surround display regions of a plurality of electro-optical devices on the substrate, a peripheral electrode that is provided between the sealing section and the display regions, wiring that is electrically connected to a plurality of peripheral electrodes provided in each of the plurality of electro-optical devices, and a terminal that is electrically connected to the wiring.

In this case, since the plurality of peripheral electrodes provided in each of the plurality of electro-optical devices is connected to the terminal through the wiring, it is even possible to suppress the spread of impurities to an effective pixel region as a result of the peripheral electrode in a case in which impurities are included in the electro-optical substance or impurities are brought in together with the electro-optical substance by applying a voltage to the terminal at the time of dripping the electro-optical substance onto the area surrounded by the sealing materials after forming the sealing materials in the sealing section. In addition, since a plurality of electro-optical devices are imposed on the substrate for an electro-optical device, a voltage is applied to the terminal that is connected to the peripheral electrode formed in each of the plurality of electro-optical devices and the devices are configured such that impurities do not spread, it is possible to enclose liquid crystal between a pair of substrates while suppressing the spread of impurities in a large (mother substrate) state. As a result of this, it is possible to improve productivity.

Application Example 10

According to Application Example 10, there is provided a substrate for an electro-optical device including a sealing section, a portion of which is open, to surround display regions of a plurality of electro-optical devices on the substrate, a peripheral electrode that is provided between the sealing section and the display regions, wiring that is electrically connected to a plurality of peripheral electrodes provided in each of the plurality of electro-optical devices, and a terminal that is electrically connected to the wiring.

In this case, since the plurality of peripheral electrodes provided in each of the plurality of electro-optical devices is connected to the terminal through the wiring, it is even possible to suppress the spread of impurities to an effective pixel region as a result of the peripheral electrode in a case in which impurities are included in the electro-optical substance or impurities are brought in together with the electro-optical substance by applying a voltage to the terminal at the time of injecting the electro-optical substance into the area surrounded by the sealing materials after forming the sealing materials in the sealing section. In addition, since a plurality of electro-optical devices are imposed on the substrate for an electro-optical device, a voltage is applied to the terminal that is connected to the peripheral electrode formed in each of the plurality of electro-optical devices and the devices are configured such that impurities do not spread, it is possible to enclose liquid crystal between a pair of substrates while suppressing the spread of impurities in a large (mother substrate) state. As a result of this, it is possible to improve productivity.

BRIEF DESCRIPTION OF THE DRAWINGS

The invention will be described with reference to the accompanying drawings, wherein like numbers reference like elements.

FIG. 11 is a flowchart that shows the order of the processes of a method for producing a liquid crystal device.

DESCRIPTION OF EXEMPLARY EMBODIMENTS

Hereinafter, embodiments that embody the present invention will be described according to the drawings. Additionally, the drawings that are used are displayed enlarged or reduced as appropriate so that the portions that are being described are recognizable.

Additionally, in the embodiments below, for example, in a case in which the description "on the substrate" is used, a situation of being disposed in contact with the top of the substrate, a situation of being arranged on top of the substrate through another component, or a situation of a portion thereof being disposed so as to be in contact with the top of the substrate and a portion thereof being disposed through another component is being described.

In the present embodiment, the description will be given using an active matrix type liquid crystal device provided with a thin film transistor (TFT) as the pixel switching element as an example of an electro-optical device. Such a liquid crystal device can for example, be used suitably as a light modulation element (liquid crystal light bulb) of a projection type display device (liquid crystal projector).

First Embodiment

Figure 1:
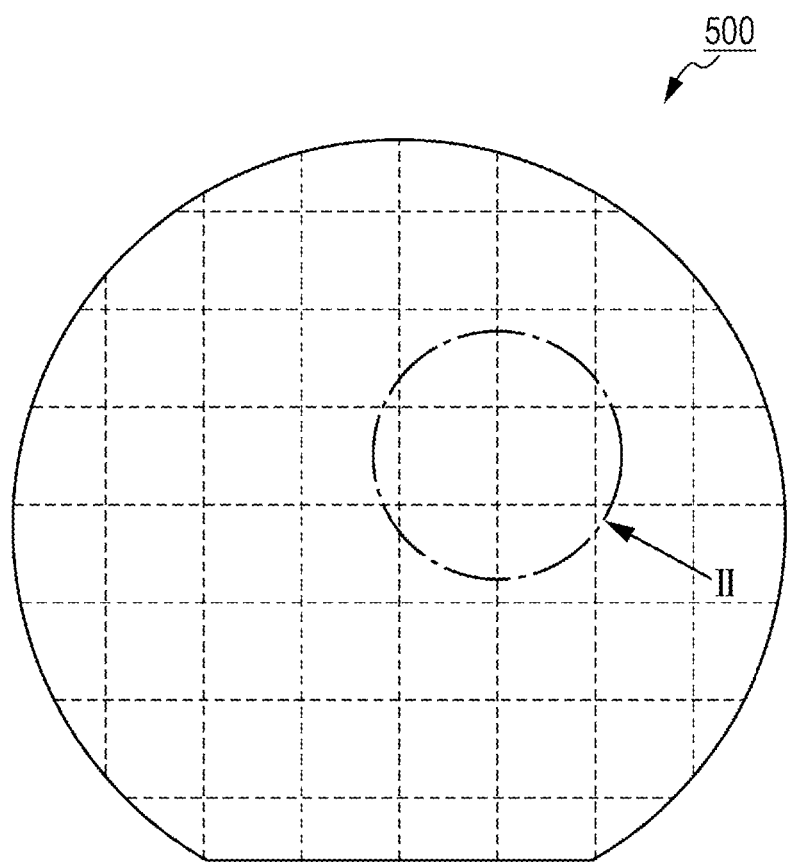
FIG. 1 is a schematic plan view that shows the configuration of a mother substrate as a substrate for an electro-optical device.
Figure 2:
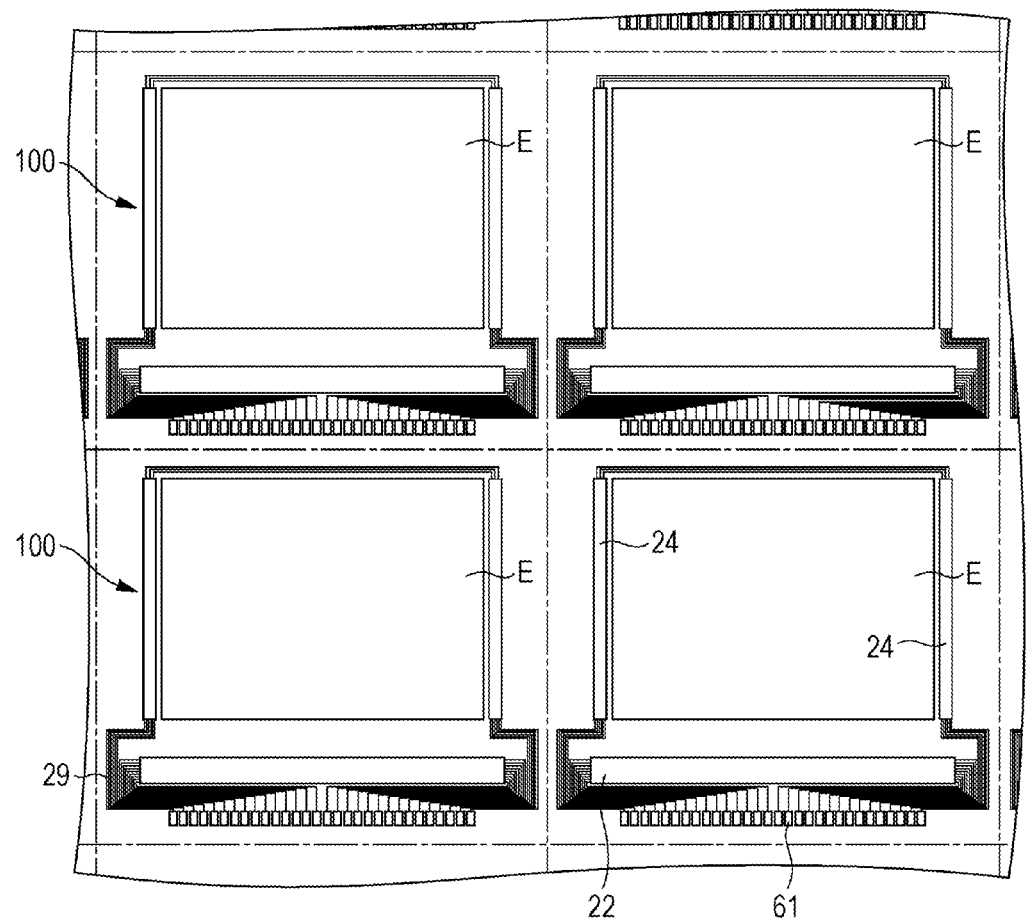
FIG. 2 is an enlarged plan view that shows a portion II of the mother substrate shown in FIG. 1 enlarged.

FIG. 1 is a schematic plan view that shows the configuration of a mother substrate as a substrate for an electro-optical device. FIG. 2 is an enlarged plan view that shows a portion II of the mother substrate shown in FIG. 1 enlarged. Hereinafter, the configuration of a mother substrate will be described with reference to FIGS. 1 and 2.

As shown in FIG. 1, a mother substrate 500 is used in the production of a liquid crystal device 100 (refer to FIG. 3) for example, and a plurality thereof are imposed in matrix form on one substrate (for example, the element substrate) of the pair of substrates that configure the liquid crystal device 100. The size of the mother substrate 500 is for example, 8 inches. The thickness of the mother substrate 500 is for example, 1.2 mm. The material of the mother substrate 500 is for example, quartz.

Additionally, the mother substrate 500 is not limited to being a circle in plan form, but as shown in FIG. 1, may be a form that has an orientation flat in which a portion of the perimeter of the circle has been cut out.

As shown in FIG. 2, in each liquid crystal device 100, a data line drive circuit 22, a scanning line drive circuit 24 and a terminal for external connections 61 are formed at the periphery of a pixel region E (display region) as peripheral circuits. The data line drive circuit 22 and the scanning line drive circuit 24 are mutually electrically connected to the terminal for external connections 61 by wiring 29. Hereinafter, description of various processes that are carried out on the mother substrate 500 and the configuration of the liquid crystal device 100 that is finally formed will be given.

Configuration of Liquid Crystal Device as Electro-Optical Device

Figure 3:
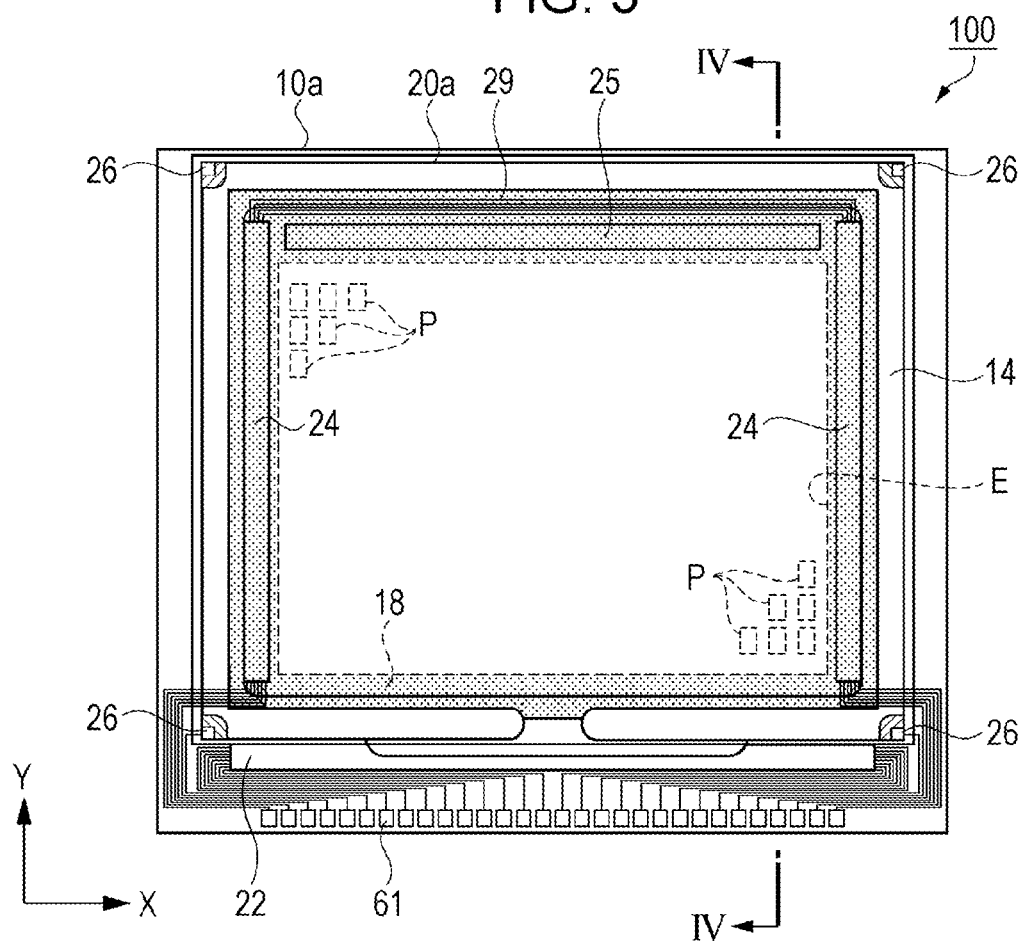
FIG. 3 is a schematic plan view that shows the configuration of a liquid crystal device of a first embodiment.
Figure 4:
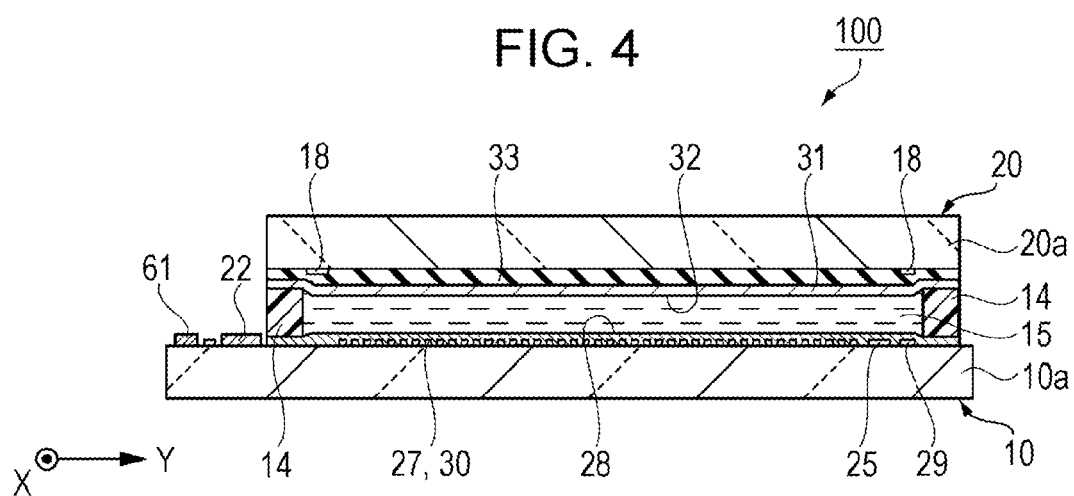
FIG. 4 is a schematic cross section along a line IV-IV of the liquid crystal device shown in FIG. 3.
Figure 5:
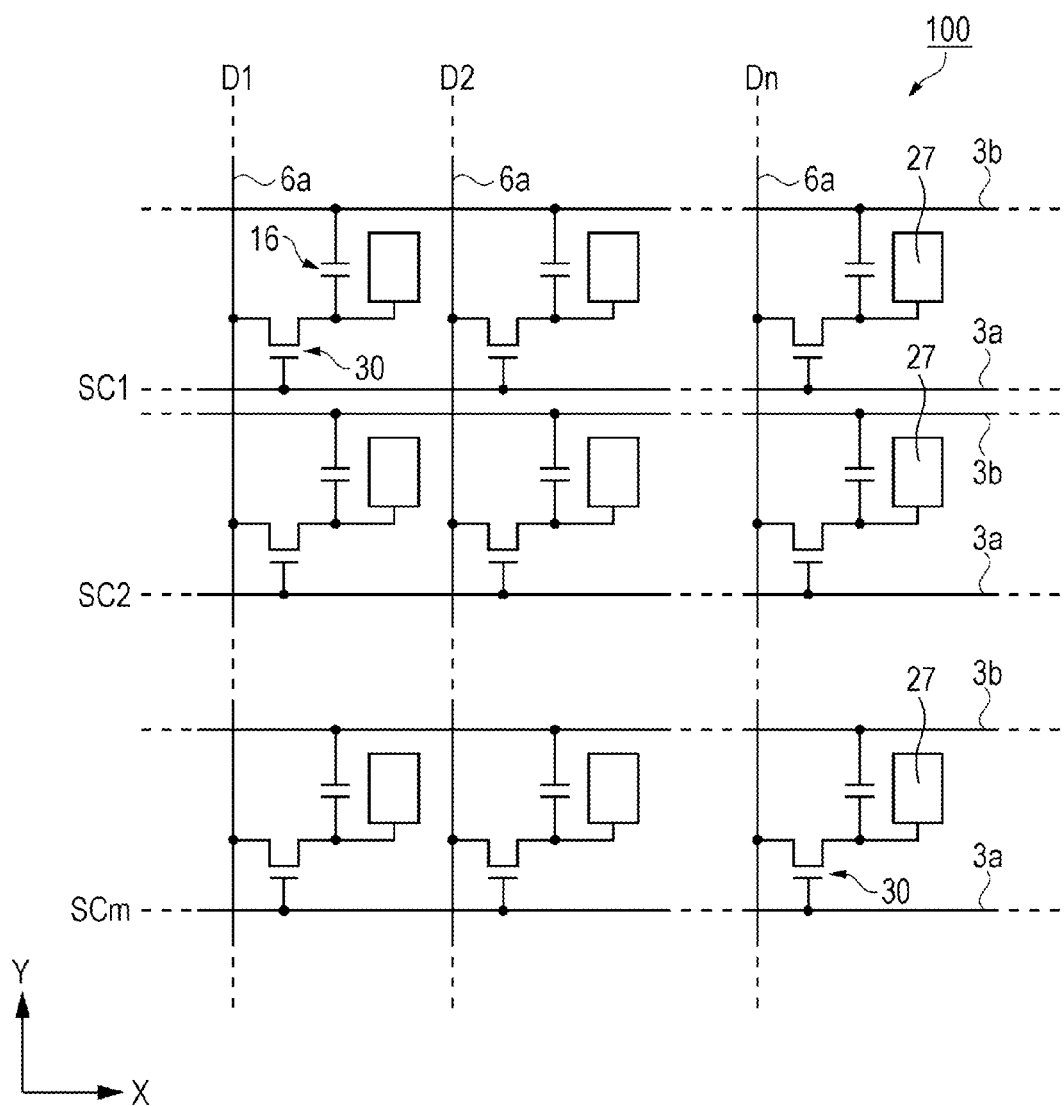
FIG. 5 is an equivalent circuit schematic that shows the electrical configuration of the liquid crystal device.

Firstly, a liquid crystal device of the present embodiment will be described with reference to FIGS. 3 to 5. FIG. 3 is a schematic plan view that shows the configuration of a liquid crystal device. FIG. 4 is a schematic cross section along a line IV-IV of the liquid crystal device shown in FIG. 3. FIG. 5 is an equivalent circuit schematic that shows the electrical configuration of the liquid crystal device.

As shown in FIGS. 3 and 4, the liquid crystal device 100 of the present embodiment includes an element substrate 10 and an opposing substrate 20 that are disposed to oppose one another, and a liquid crystal layer 15 that is sandwiched by the pair of substrates. A first base material 10a as a substrate that configures the element substrate 10 and a second base material 20a that configures the opposing substrate 20 use for example, a transparent substrate such as a glass substrate or a quartz substrate.

The element substrate 10 is larger than the opposing substrate 20, and both substrates are bonded together through sealing materials 14 that are disposed along the outer periphery of the opposing substrate 20. The liquid crystal layer 15 is configured by liquid crystal (electro-optical substance) that has either positive or negative dielectric anisotropy being enclosed in the gap between the substrates. The sealing materials 14 for example, use an adhesive such as a thermosetting or ultraviolet curable epoxy resin. A spacer (not shown in the drawing) for retaining the space between the pair of substrates uniform is mixed in the sealing materials 14.

A pixel region E in which a plurality of pixels P are arranged is provided inside the sealing materials 14. In addition to the plurality of pixels P that contribute to display, the pixel region E may include dummy pixels disposed to surround the plurality of pixels P. In addition, although omitted from FIGS. 1 and 2, a light shielding section (black matrix; BM) that respectively divides the plurality of pixels P in a planar manner is provided on the opposing substrate 20 in the pixel region E.

The data line drive circuit 22 is provided between the sealing materials 14 along a side section of the element substrate 10 and the side section. In addition, a scanning circuit 25 is provided between the sealing materials 14 along another side section that is opposite the abovementioned side section and the pixel region E. Furthermore, scanning line drive circuits 24 are provided between the sealing materials 14 along two side sections that are orthogonal to the abovementioned side section and mutually oppose one another and the pixel region E. A plurality of wiring 29 that connects the two scanning line drive circuits 24 is provided between the sealing materials 14 along another side section that is opposite the abovementioned side section and the scanning circuit 25.

A light shielding section 18 (border section) is provided in the same frame form inside the sealing materials 14 disposed in frame form on the opposing substrate 20. The light shielding section 18 is formed from a metal or a metal oxide that has a light shielding property for example, and the inside of the light shielding section 18 forms the pixel region E that has a plurality of pixels P. Additionally, although omitted from FIG. 3, a light shielding section that divides the plurality of pixels P in a planar manner is also provided in the pixel region E.

The wiring that connects the data line drive circuit 22 and the scanning line drive circuit 24 is connected to a plurality of terminals for external connections 61 arranged along the abovementioned side section. Hereinafter, description will be given referring to a direction along the abovementioned side section as an X direction and a direction along two different side sections that are orthogonal to the abovementioned side section and mutually oppose one another as a Y direction. Additionally, the desposition of the scanning circuit 25 is not limited thereto, and may be provided between the sealing materials 14 along the data line drive circuit 22 and the pixel region E.

In addition, although not displayed in the drawing, a peripheral electrode (refer to FIG. 7) is provided between the pixel region E and the sealing materials 14 so as to surround the pixel region E. The peripheral electrode is configured from for example, a pair of peripheral electrodes (a first peripheral electrode and a second peripheral electrode), and is provided so that ionic impurities do not spread to the inside of the pixel region E. Detailed description thereof will be given later.

As shown in FIG. 4, a translucent pixel electrode 27 and a thin film transistor (TFT, hereinafter referred to as a "TFT 30") as a switching element, which are provided in each pixel P, signal wiring, and a first alignment film 28 which covers the foregoing are formed on the front surface of the liquid crystal layer 15 side of the first base material 10a.

In addition, a light shielding structure which prevents a switching operation from becoming irregular due to light being input into a semiconductor layer in the TFT 30 is adopted. The element substrate 10 in the present invention includes at least the pixel electrode 27, the TFT 30, the signal wiring and the first alignment film 28.

The light shielding section 18, a planarization layer 33 that is formed to cover the foregoing, a common electrode 31 that is formed to cover the planarization layer 33, and a second alignment film 32 that is formed to cover the common electrode 31 are provided on the front surface of the liquid crystal layer 15 side of the opposing substrate 20. The opposing substrate 20 in the present invention includes at least the light shielding section 18, the common electrode 31 and the second alignment film 32.

As shown in FIG. 3, the light shielding section 18 is provided in a position which overlaps the scanning line drive circuit 24 and the scanning circuit 25 in a planar manner in addition to encompassing the pixel region E. As a result of this, light that is input to peripheral circuits including these drive circuits from the opposing substrate 20 is masked, and the peripheral circuits serve a purpose of preventing false operation as a result of light. In addition, stray light that is not necessary is masked so as not to be input into the pixel region E, the high contrast in the display of the pixel region E is maintained.

The planarization layer 33 is formed from an inorganic material such as silicon oxide for example, is light transmissive and is provided to cover the light shielding section 18. As a method for forming such a planarization layer 33, for example, a method that forms a film using a plasma CVD (Chemical Vapor Deposition) method or the like may be used.

The common electrode 31 is formed from a transparent conductive film such as ITO (Indium Tin Oxide) for example, and as shown in FIG. 3, and in addition to covering the planarization layer 33, is electrically connected to the wiring of the element substrate 10 side by vertical conductive sections 26 that are provided in the four corners of the opposing substrate 20.

The first alignment film 28 that covers the pixel electrode 27 and the second alignment film 32 that covers the common electrode 31 are selected on the basis of the optical design of the liquid crystal device 100. For example, an organic alignment film, which is formed from an organic material such as a polyimide, on which a substantially horizontal alignment treatment with respect to liquid crystal molecules that have positive dielectric anisotropy has been carried out through rubbing of the surface thereof, or an inorganic alignment film, which is formed from an inorganic material such as a SiOx (silicon oxide) using vapor-phase growth, with a substantially vertical alignment with respect to liquid crystal molecules that have negative dielectric anisotropy can be used. In the present embodiment, the first alignment film 28 and the second alignment film 32 use the abovementioned inorganic alignment film.

This kind of liquid crystal device 100 is for example, a transmissive type, and can use a normally white mode in which the pixels P are light when not being driven or a normally black mode in which the pixels P are dark when not being driven. Polarizing elements may be disposed and used on the light input side or output side depending on the optical design. In the present embodiment, a normally black mode is adopted.

As shown in FIG. 5, in the pixel region E, the liquid crystal device 100 includes at least a plurality of scanning lines 3a and a plurality of data lines 6a that are orthogonal and are mutually insulated from one another and capacity lines 3b. The direction in which the scanning lines 3a extend is the X direction and the direction in which the data lines 6a extend is the Y direction.

The pixel electrode 27, the TFT 30 and a capacity element 16 are provided in a region divided by the scanning lines 3a, the data lines 6a and the capacity lines 3b, and these signal line types configure a pixel circuit of the pixels P.

The scanning lines 3a are electrically connected to a gate of the TFT 30, and the data lines 6a are electrically connected to a data line side source and drain region (source region) of the TFT 30. The pixel electrode 27 is electrically connected to a pixel electrode side source and drain region (drain region) of the TFT 30.

The data lines 6a are connected to the data line drive circuit 22 (refer to FIG. 3), and image signals D1, D2, . . . , Dn that are supplied from the data line drive circuit 22 are supplied to the pixels P. The scanning lines 3a are connected to the scanning line drive circuit 24 (refer to FIG. 3), and scanning signals SC1, SC2, . . . , SCm that are supplied from the scanning line drive circuit 24 are supplied to the pixels P.

The image signals D1 to Dn that are supplied to the data lines 6a from the data line drive circuit 22 may be supplied sequentially to each line in this order, or may be supplied to each group of a plurality of adjacent data lines 6a. The scanning line drive circuit 24 supplies the scanning signals SC1 to SCm sequentially to each scanning line 3a at a predetermined timing in pulses.

As a result of the TFT 30, which is a switching element, only being in an on state for a fixed period of time due to the input of the scanning signals SC1 to SCm, the liquid crystal device 100 has a configuration in which the image signals D1 to Dn that are supplied from the data lines 6a are written into the pixel electrode 27 at a predetermined timing. Further, image signals D1 to Dn of a predetermined level that are written into the liquid crystal layer 15 through the pixel electrode 27 are maintained between the pixel electrode 27 and the common electrode 31 disposed opposite the pixel electrode 27 through the liquid crystal layer 15 for a fixed period of time.

In order to prevent the maintained image signals D1 to Dn from leaking, a liquid crystal capacity that is formed between the pixel electrode 27 and the common electrode 31 is connected to the capacity element 16 in parallel. The capacity element 16 is provided between the source and drain region on the pixel electrode side of the TFT 30 and the capacity lines 3b. The capacity element 16 has a dielectric layer between two capacity electrodes.

Figure 6:
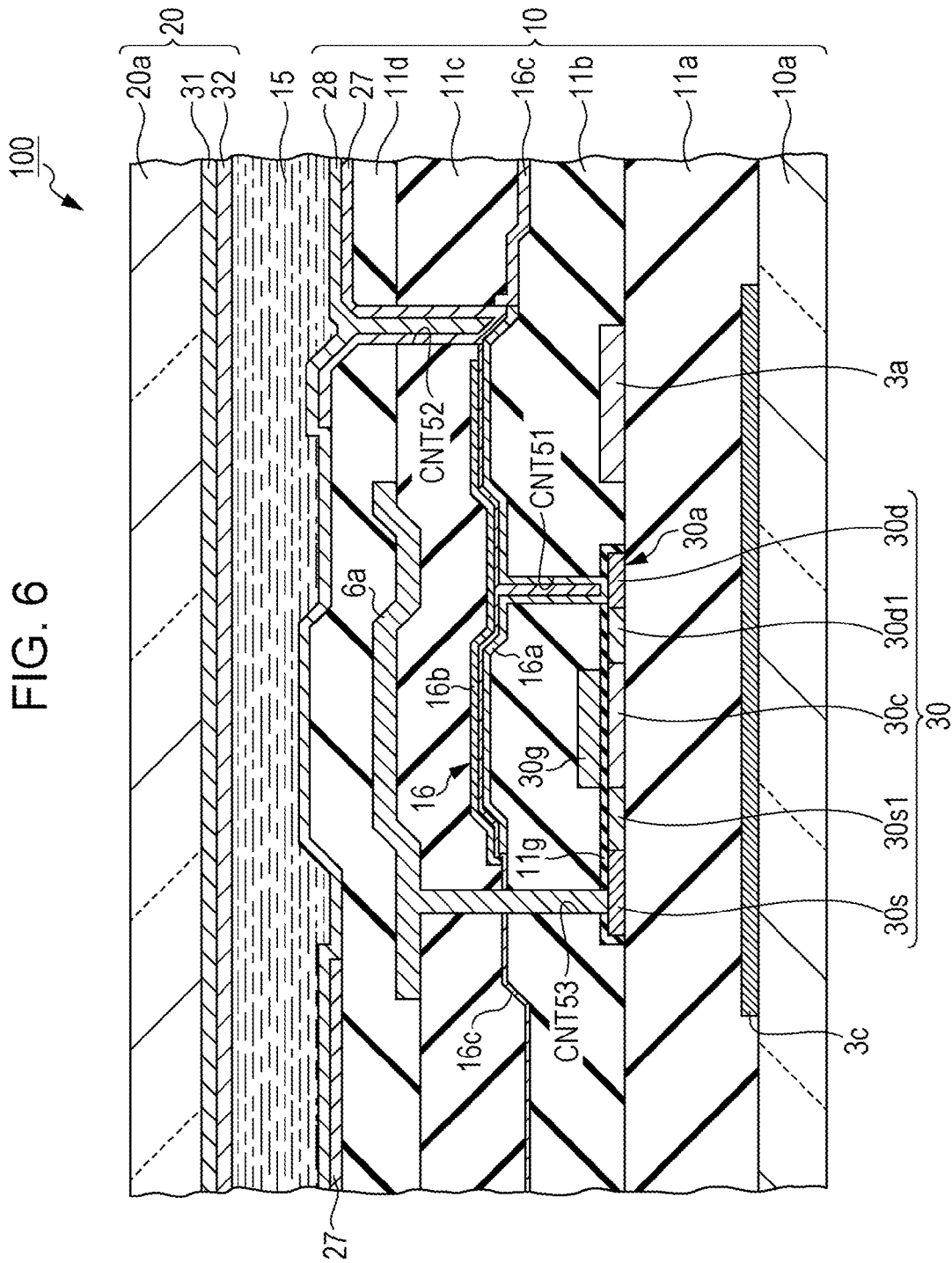
FIG. 6 is a schematic cross section that shows the configuration of the liquid crystal device.

FIG. 6 is a schematic cross section that shows the configuration of the liquid crystal device. Hereinafter, the configuration of the liquid crystal device will described with reference to FIG. 6. Additionally, FIG. 6 shows a cross sectional positional relationship of each component, and the foregoing are displayed at a scale at which each component can be clearly recognized.

As shown in FIG. 6, the liquid crystal device 100 is provided with an element substrate 10 that is one of a pair of substrates, and an opposing substrate 20 that is disposed opposite the element substrate 10 and is the other of the pair of substrates. As described above, a first base material 10a that configures the element substrate 10 and a second base material 20a that configures the opposing substrate 20 are for example, configured from a quartz substrate or the like.

An under side light shielding film 3c that is formed from titanium (Ti), Chromium (Cr) or the like is formed on the first base material 10a. The underside light shielding film 3c is patterned in lattice form in a planar manner, and defines an opening region of each pixel. Additionally, the underside light shielding film 3c may be configured to function as a portion of the scanning lines 3a. A ground insulation layer 11a that is formed from a silicon oxide film or the like is formed on the first base material 10a and the underside light shielding film 3c.

The TFT 30, the scanning lines 3a and the like are formed on the ground insulation layer 11a. The TFT 30 has a configuration which includes an LDD (Lightly Doped Drain) for example, and has a semiconductor layer 30a that is formed from polysilicon or the like, a gate insulation film 11g that is formed on the semiconductor layer 30a and a gate electrode 30g that is formed on the gate insulation film 11g and is formed from a polysilicon film or the like. In the manner described above, the scanning lines 3a function as the gate electrode 30g.

The semiconductor layer 30a is formed as an n-type TFT 30 by injecting n-type impurities such as phosphorus (P) ions. More specifically, the semiconductor layer 30a provided with a channel region 30c, a data line side LDD region 30s1, a data line side source and drain region 30s, a pixel electrode side LDD region 30d1 and a pixel electrode side source and drain region 30d.

The channel region 30c is doped with p-type impurities such as boron (B) ions or the like. Regions other than the channel region 30c (30s1, 30s, 30d1 and 30d) are doped with n-type impurities such as phosphorus (P) ions. In this manner, the TFT 30 is formed as an n-type TFT.

A first interlayer insulation film 11b that is formed from a silicon oxide film or the like is formed on the gate electrode 30g, the ground insulation layer 11a and the scanning lines 3a. The capacity element 16 is formed on the first interlayer insulation film 11b. More specifically, portions of a first capacity electrode 16a as a pixel potential side capacity electrode and the capacity lines 3b (second capacity electrode 16b) as a fixed potential side capacity electrode that are electrically connected to the pixel electrode side source and drain region 30d of the TFT 30 and the pixel electrode 27 form the capacity element 16 by being disposed opposite one another through a dielectric film 16c.

The capacity lines 3b (second capacity electrode 16b) for example, include at least one metal with a high melting point such as Ti (titanium), Cr (chromium), W (tungsten), Ta (tantalum) and Mo (molybdenum), and is formed from a metal element, an alloy, a metal silicide, polysilicide or a laminates of the foregoing. Alternatively, it is possible to form the capacity lines 3b from an Al (aluminum) film.

The first capacity electrode 16a is for example, formed from a conductive polysilicon film and functions as a pixel potential side capacity electrode of the capacity element 16. However, in the same manner as the capacity lines 3b, the first capacity electrode 16a may be configured from a single layered film or a multi-layered film that includes a metal or a metal alloy. In addition to the function as the pixel potential side capacity electrode, the first capacity electrode 16a has a function of transit connecting the pixel electrode side source and drain region 30d (drain region) of the TFT 30 to the pixel electrode 27 through contact holes CNT 51 and CNT 52.

The data lines 6a are formed on the capacity element 16 through a second interlayer insulation film 11c. The data lines 6a are electrically connected to the data line side source and drain region 30s (source region) of the semiconductor layer 30a through a contact hole CNT 53 that is opened in the first interlayer insulation film 11b and the second interlayer insulation film 11c.

The pixel electrode 27 is formed on the data lines 6a through a third interlayer insulation film 11d. The pixel electrode 27 is electrically connected to the pixel electrode side source and drain region 30d (drain region) of the semiconductor layer 30a as a result of being connected to the first capacity electrode 16a through the contact hole CNT 52 that is opened in the second interlayer insulation film 11c and the third interlayer insulation film 11d. Additionally, the pixel electrode 27 is formed for example, from a transparent conductive film such as an ITO (Indium Tin Oxide) film.

A first alignment film 28 in which an inorganic material such as silicon dioxide ($SiO_2$) has been obliquely deposited is provided on the pixel electrode 27 and the third interlayer insulation film 11d. A liquid crystal layer 15 in which an electro-optical substance such as liquid crystal is sealed in the space surrounded by the sealing materials 14 (refer to FIG. 4) is provided on the first alignment film 28.

Meanwhile, the common electrode 31 is provided on the second base material 20a to span the entire surface thereof. A second alignment film 32 in which an inorganic material such as silicon dioxide ($SiO_2$) has been obliquely deposited is provided on the common electrode 31 (the lower side of FIG. 6). The common electrode 31 is formed from a transparent conductive film such as ITO for example, in the same manner as the pixel electrode 27 described above.

In a state in which an electric field from the pixel electrode 27 is not being applied, the liquid crystal layer 15 has a predetermined alignment state as a result of the first alignment film 28 and the second alignment film 32. The sealing materials 14 are adhesives for bonding the element substrate 10 and the opposing substrate 20 together at the peripheries thereof, which are formed from a photocurable resin or a thermosetting resin for example, and spacers such as glass fibers or glass beads for setting the distance between the two substrates to be a predetermined value are mixed therein. Hereinafter, the configuration of a mother substrate in which a plurality of element substrates have been imposed will be described.

Configuration of Mother Substrate as Substrate for Electro-Optical Device

Figure 7:
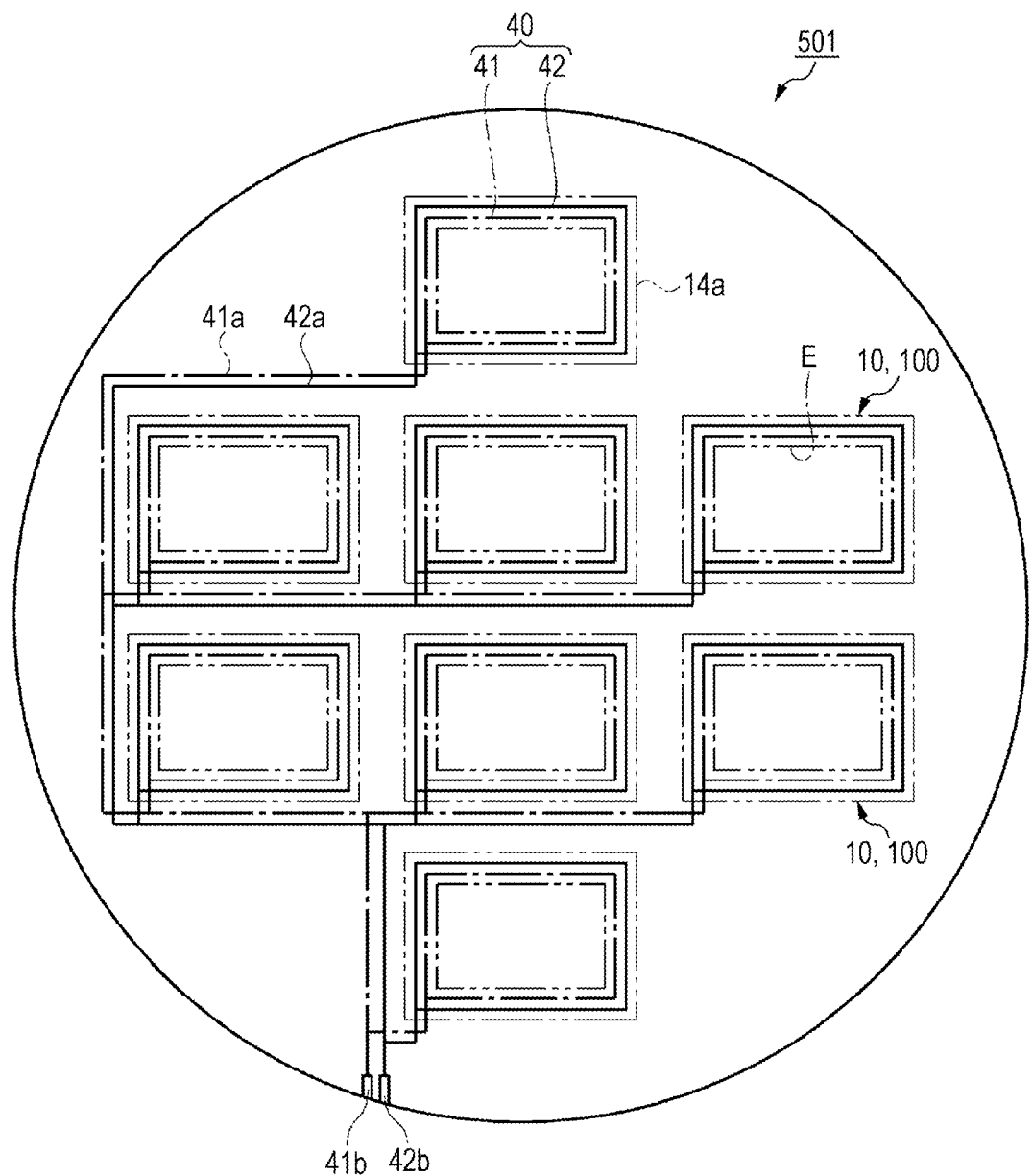
FIG. 7 is a schematic plan view that shows the configuration of a mother substrate of an ODF method.

FIG. 7 is a schematic plan view that shows the configuration of an ODF method mother substrate (first substrate) as a substrate for an electro-optical device in which a plurality of element substrates have been imposed. Hereinafter, the configuration of the ODF method mother substrate will be described with reference to FIG. 7.

As shown in FIG. 7, a plurality of element substrates 10 are imposed in the manner described above on the element side of the mother substrate 501. A first peripheral electrode 41 and a second peripheral electrode 42, which is disposed at the perimeter of the first peripheral electrode 41, that configure a pair of peripheral electrodes 40 are disposed at the perimeter of a pixel region E.

The distance between the pair of peripheral electrodes 40 and the pixel region E is for example, 200 μm. The gap between the first peripheral electrode 41 and the second peripheral electrode 42 is for example, 5 μm. The width of the first peripheral electrode 41 and the second peripheral electrode 42 is for example, 10 μm.

The first peripheral electrode 41 and the second peripheral electrode 42 are for example, provided in the same layer as the pixel electrode 27 (refer to FIG. 6) and are formed by an ITO film. In addition, the perimeter of the pair of peripheral electrodes 40 has sealing definition regions 14a (sealing sections) which are regions that define the sealing materials 14.

The first peripheral electrode 41 in the plurality of element substrates 10 is electrically connected to all of the first peripheral electrodes 41 through routing wiring 41a (wiring). The routing wiring 41a is electrically connected to an external terminal 41b (terminal) for the first peripheral electrode that is provided in a portion of the element side of the mother substrate 501.

In addition, the second peripheral electrode 42 in the plurality of element substrates 10 is electrically connected to all of the second peripheral electrodes 42 through routing wiring 42a (wiring). The routing wiring 42a is electrically connected to an external terminal 42b (terminal) for the second peripheral electrode that is provided in a portion of the element side of the mother substrate 501.

In addition, in portions in which the routing wiring 41a and the routing wiring 42a intersect, it is desirable that either one or the other is electrically connected through a metal wiring layer provided in a bottom layer thereof (routed in bridge form).

In addition, in order to prevent contact between the opposing side of the mother substrate and the external terminal 41b for the first peripheral electrode and the external terminal 42b for the second peripheral electrode formed on the element side of the mother substrate 501 at the time of bonding the element side of the mother substrate 501 and an opposing side of the mother substrate (second substrate) together, it is preferable that the external terminal 41b for the first peripheral electrode and the external terminal 42b for the second peripheral electrode be made to overlap with the orientation flat position of the opposing side of the mother substrate, or in other words, that the external terminals for the peripheral electrodes 41b and 42b be disposed so as to be exposed.

In addition, in a case in which the orientation flat positions of the pair of mother substrates 500 are matched and bonded together, the external terminals for the peripheral electrodes 41b and 42b may be formed on the side surface of the element substrate side of the mother substrate 501.

In addition, it is preferable that the gap between the routing wiring 41a and the routing wiring 42a wider than the gap between the first peripheral electrode 41 and the second peripheral electrode 42 so that the routing wiring 41a and the routing wiring 42a do not come into contact. In addition, the wire width of the routing wiring 41a and 42a may be set to be wider than the wire width of the pair of peripheral electrodes 41 and 42 which are set to 10 μm, and for example, may be set to 20 μm. As a result of making the wire width thick, it is possible to reliably supply a voltage to the plurality of peripheral electrodes 40 that correspond to the plurality of element substrates 10.

In this type of configuration, as a result of different voltages being applied to the external terminal 41b for the first peripheral electrode and the external terminal 42b for the second peripheral electrode, it becomes possible to generate a difference in potential at the perimeter of the pixel region E in the plurality of element substrates 10, and it is even possible to suppress the spread of impurities to the pixel region E as a result of the peripheral electrode 40 in a case in which impurities are included in the liquid crystal that is dripped onto the area that is surrounded by the sealing materials 14 or impurities are brought in together with the liquid crystal in the production process.

In addition, since a voltage is applied collectively to a plurality of element substrates 10 by the routing wiring 41a and 42a, it is possible to enclose liquid crystal between the pair of substrates 10 and 20 while suppressing the spread of ionic impurities in a large (mother substrate) state. As a result of this, it is possible to improve productivity.

Method for Producing Electro-Optical Device (Method for Producing Mother Substrate (Liquid Crystal Device))

Figure 8:
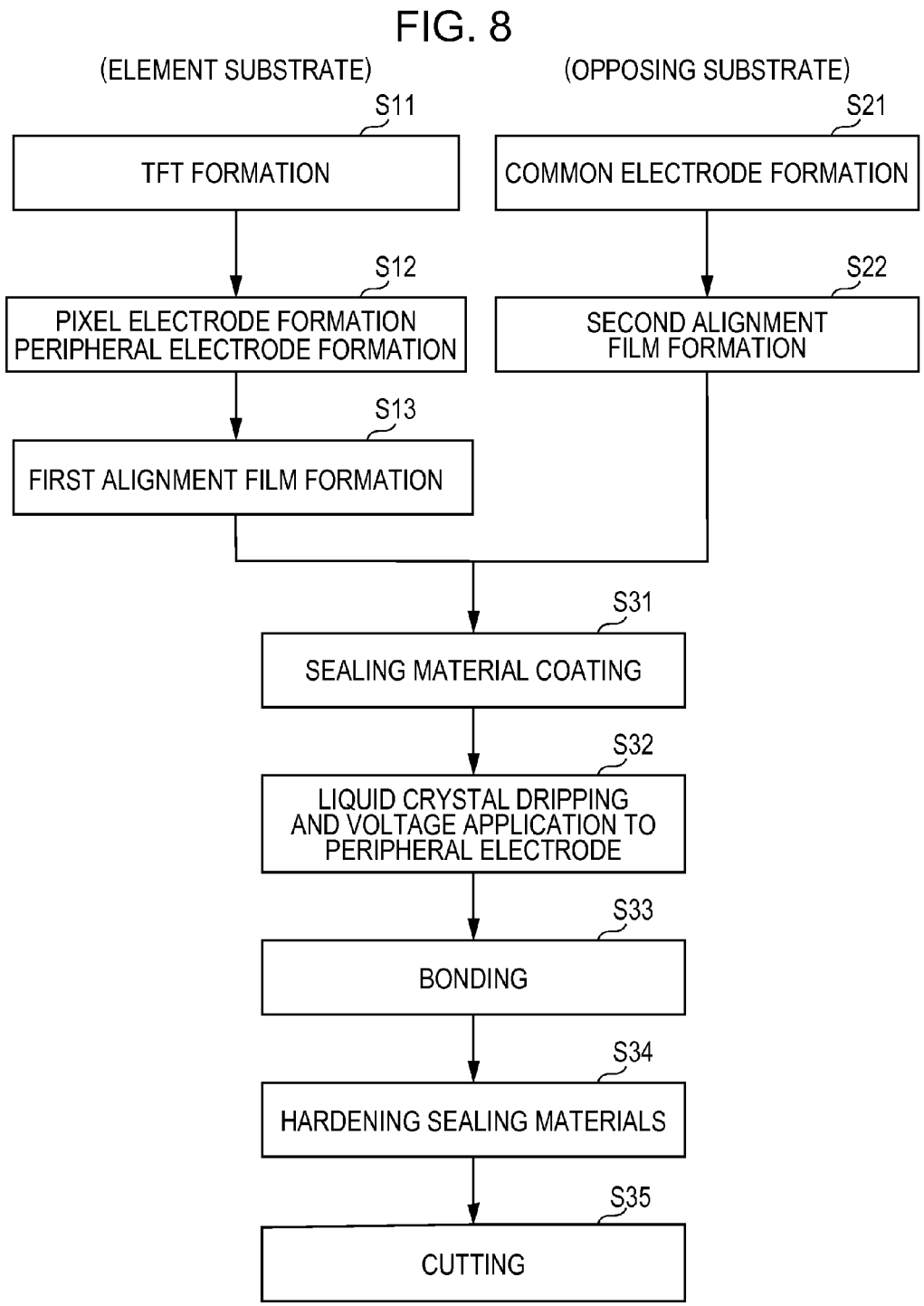
FIG. 8 is a flowchart that shows the order of the processes of a method for producing a liquid crystal device.

FIG. 8 is a flowchart that shows the order of the processes of a method for producing a liquid crystal device. Hereinafter a method for producing a liquid crystal device will described with reference to FIG. 8. Additionally, a method for producing a single liquid crystal device 100 will be described, but effectively, the method forms a plurality of liquid crystal devices 100 simultaneously using the mother substrate 500.

Firstly, a method for producing the element substrate 10 side will be described. In Step S11, a TFT 30 and the like are formed on the first base material 10a that is formed from a quartz substrate or the like. More specifically, a TFT 30 and the like are formed on the first base material 10a using well-known film formation techniques, photolithography techniques and etching techniques.

In Step S12, the pixel electrode 27 and peripheral electrode 40 are formed. More specifically, the pixel electrode 27 that is formed from an ITO film or the like, the peripheral electrode 40 (the first peripheral electrode 41 and the second peripheral electrode 42), the routing wiring 41a and 42a and the external terminals for the peripheral electrodes 41b and 42b are formed using well-known photolithography techniques and etching techniques. Thereafter, a passivation layer (not displayed in the drawing) is formed on the entirety of the substrate that includes the pixel electrode 27 and the peripheral electrode 40. In addition, a CMP polishing treatment is performed to planarized unevenness that is generated on the upper surface of the passivation layer.

In Step S13, the first alignment film 28 is formed. More specifically, the first alignment film 28 is formed to cover the passivation layer. As a method for producing the first alignment film 28, for example, an oblique deposition method which obliquely deposits an inorganic material such as silicon dioxide ($SiO_2$) can be used.

According to the present embodiment, the it could be thought that there is a tendency for ionic impurities to accumulate in the pixel region E since the affinity of the ionic impurities and the inorganic alignment film is high, but since the peripheral electrode 40 is formed at the perimeter of the pixel region E, it is possible to suppress the spread of ionic impurities to the inside of the pixel region E. Accordingly, it is possible to suppress deteriorations in image quality. The element substrate 10 side is completed using the abovementioned steps. Additionally, an element substrate 10 on which the abovementioned components are formed (element substrate side of the mother substrate 501) may be prepared separately.

Next, a method for producing an opposing substrate 20 side will be described. Firstly, in Step S21, a common electrode 31 is formed on the second base material 20a that is formed from a translucent material such as a quartz substrate using well-known film formation techniques, photolithography techniques and etching techniques.

In Step S22, the second alignment film 32 is formed on the common electrode 31. The method for producing the second alignment film 32 is similar to the case of the first alignment film 28, and for example, an oblique deposition method can be used. The opposing substrate 20 side is completed using the abovementioned steps. Additionally, an opposing substrate 20 (opposing side of the mother substrate) on which the abovementioned components are formed may be prepared separately. Next, a method for bonding the element substrate 10 and the opposing substrate 20 together will be described.

In Step S31 (step 1), the sealing materials 14 are coated onto the sealing definition regions 14a on the element side of the mother substrate 501 (element substrate 10). In more detail, the sealing materials 14 are coated onto a peripheral border section (so as to surround the pixel region E) of the pixel region E in the mother substrate 501 by changing the relative positional relationship between the mother substrate 501 and a dispenser (both a discharge device and screen printing are possible).

In Step S32 (step 2), dripping of liquid crystal and voltage application to the peripheral electrode are performed. More specifically, liquid crystal is dripped (ODF method) onto a region that is surrounded by each sealing material 14 on the element side of the mother substrate 501. As the method for dripping the liquid crystal, for example, it is possible to use an ink jet head or the like. In addition, it is desirable that the liquid crystal be dripped onto the centre of the region (pixel region E) that is surrounded by the sealing materials 14.

In addition, a voltage is applied to the first peripheral electrode 41 and the second peripheral electrode 42. More specifically, a voltage is applied to respective first peripheral electrodes 41 through the external terminal 41b for the first peripheral electrode and the routing wiring 41a. A direct current of for example, 0 V is applied to the first peripheral electrode 41 that is disposed on the pixel region E side.

In addition, a voltage is applied to respective second peripheral electrodes 42 through the external terminal 42b for the second peripheral electrode and the routing wiring 42a. A direct current of for example, −5 V is applied to the second peripheral electrode 42 that is disposed outside the first peripheral electrode 41.

In Step S33 (step 3 and step 4), the element substrate 10 and the opposing substrate 20 are bonded together. More specifically, the element substrate 10 and the opposing substrate 20 are bonded together through the sealing materials 14 coated on the element substrate 10 (element side of the mother substrate 501). Even more specifically, the process is performed while maintaining the positional accuracy of the mutual planar vertical direction and horizontal direction of the substrates 10 and 20. Thereafter, in Step S34, the sealing materials 14 are hardened.

As described above, since a voltage is applied to the pair of peripheral electrodes 40, it is possible to suppress positive (+) ionic impurities that are deemed as impurities from spreading from the outside to the inside. More specifically, the liquid crystal is retained in the pixel region E, and using the pair of peripheral electrodes 41 and 42, it is possible to suppress ionic impurities from entering the pixel region E.

In Step S35, the pair of mother substrates 500 are cut. More specifically, the pair of mother substrate 500 that have been bonded together are cut along a scribe line in units of liquid crystal devices 100, and individual liquid crystal devices 100 are completed. Additionally, as a result of the cutting, a region of the routing wiring 41a and 42a is cut, and is not left in the centre of the liquid crystal device 100.

Electronic Apparatus

Figure 9:
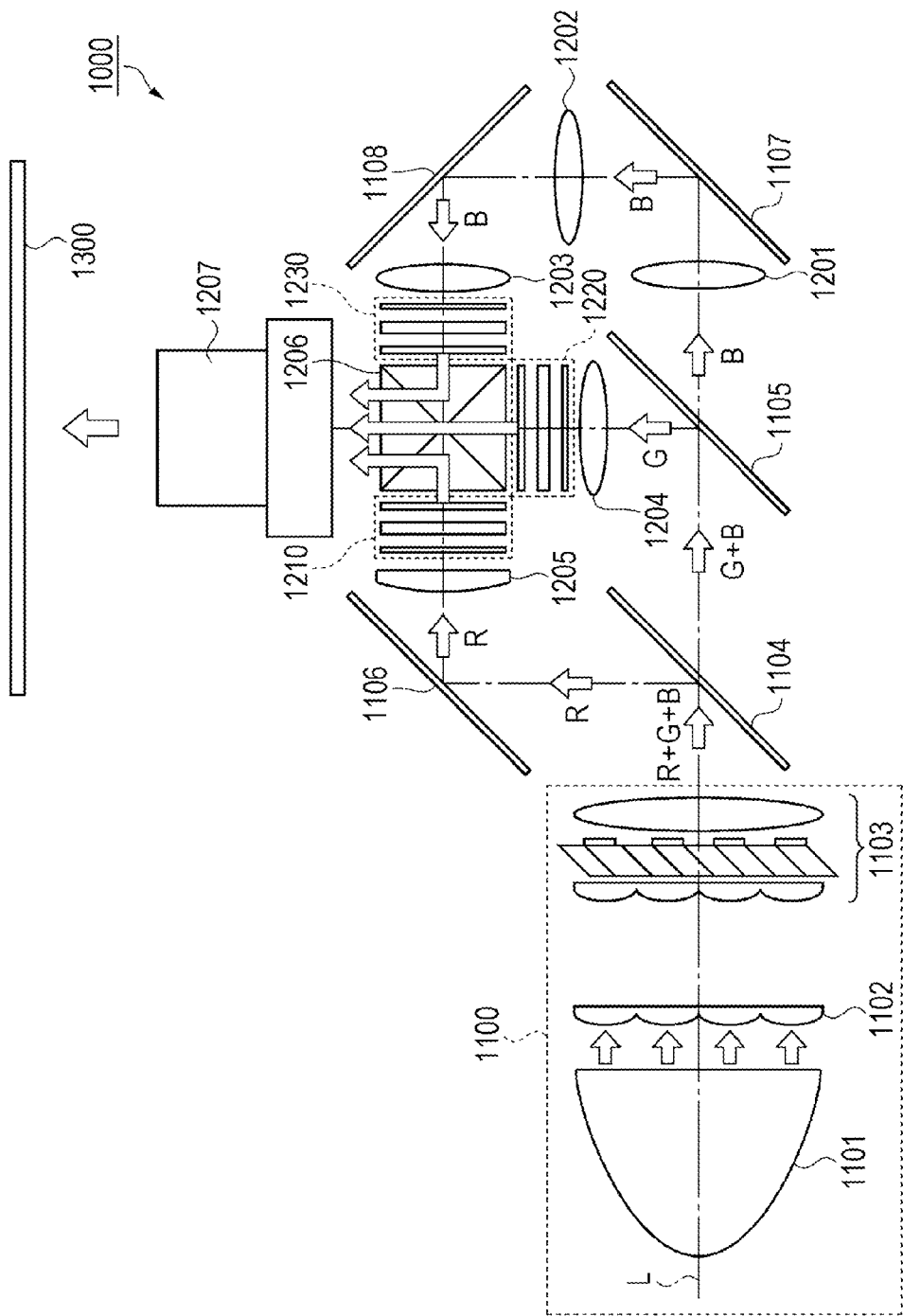
FIG. 9 is a schematic view that shows the configuration of a projection type display device provided with a liquid crystal device.

Next, a projection type display device will be described as an electronic apparatus of the present embodiment with reference to FIG. 9. FIG. 9 is a schematic view that shows the configuration of a projection type display device provided with the abovementioned liquid crystal device.

As shown in FIG. 9, a projection type display device 1000 as an electronic apparatus of the present embodiment is provided with a polarized light illumination device 1100 that is disposed along a system optical axis L, two dichromatic mirrors 1104 and 1105 as optical isolation elements, three reflective mirrors 1106, 1107 and 1108, five relay lenses 1201, 1202, 1203, 1204 and 1205, three transmissive liquid crystal light bulbs 1210, 1220 and 1230 as optical modulation means, a cross dichroic prism 1206 as an optical synthesis element and a projection lens 1207.

The polarized light illumination device 1100 has a schematic configuration which includes a lamp unit 1101 as a light source that is formed from a white light source such as an ultrahigh pressure mercury lamp or a halogen lamp, an integrator lens 1102 and a polarized light conversion element 1103.

Among polarized light beams that are output by the polarized light illumination device 1100, the dichromatic mirror 1104 reflects red light (R) and transmits green light (G) and blue light (B). A different dichromatic mirror 1105 reflects the green light (G) that was transmitted by the dichromatic mirror 1104 and transmits the blue light (B).

The red light (R) that was reflected by the dichromatic mirror 1104 is input into the liquid crystal light bulb 1210 via the relay lens 1205 after being reflected by the reflective mirror 1106. The green light (G) that was reflected by the dichromatic mirror 1105 is input into the liquid crystal light bulb 1220 via the relay lens 1204. The blue light (B) that was transmitted by the dichromatic mirror 1105 is input into the liquid crystal light bulb 1230 via an optical guiding system that is formed from the three relay lenses 1201, 1202 and 1203 and the two reflective mirrors 1107 and 1108.

The liquid crystal light bulbs 1210, 1220 and 1230 are respectively disposed opposite the input surfaces of each color of light of the cross dichroic prism 1206. The color of light that is input into the liquid crystal light bulbs 1210, 1220 and 1230 adjusted on the basis of image information (an image signal) and is output toward the cross dichroic prism 1206.

This prism is configured by bonding four right angle prisms together and forming a dielectric multilayer that reflects red light and a dielectric multilayer that reflects blue light in cross form on the inside thereof. The three types of colored light are synthesized by these dielectric multilayers, and light that can render a color image is synthesized. The synthesized light projected on a screen 1300 by the projection lens 1207, which is an optical system for projection, and an image is enlarged and displayed.

The liquid crystal light bulb 1210 uses the liquid crystal device 100 described above. The liquid crystal device 100 disposed in the gap between a pair of polarization elements that are disposed in crossed Nichol form on the input side and the output side of colored light. The other liquid crystal light bulbs 1220 and 1230 are similar.

According to this kind of projection type display device 1000, since the liquid crystal device 100, in which the display unevenness and burn-in phenomena that result from ionic impurities are reduced, is used as the liquid crystal light bulbs 1210, 1220 and 1230, it is possible to realize a high display quality and reliability.

As described above, according to the method for producing the liquid crystal device 100 of the first embodiment and the mother substrate 501, it is possible to obtain the effects indicated below.

(1) According to the method for producing the liquid crystal device 100 of the first embodiment, since voltage application to the peripheral electrode 40 is performed at the time of dripping liquid crystal onto the element substrate 10, it is even possible to suppress the spread of ionic impurities to the inside of the pixel region E as a result of the peripheral electrode 40 in a case in which ionic impurities are included in the liquid crystal or ionic impurities are brought in together with the liquid crystal. In other words, it is possible to move the ionic impurities outside the pixel region E. In addition, it is possible to move ionic impurities that are exuded into the liquid crystal layer 15 from unhardened sealing materials 14 outside the pixel region E. As a result of this, it is possible to reduce the concentration of ionic impurities inside the pixel region E, and it is possible to suppress the generation of display defects such as burn-in and display unevenness.

(2) According to the method for producing the liquid crystal device 100 of the first embodiment, since a plurality of element substrates 10 are imposed on the element side of the mother substrate 501, a voltage is applied to the external terminals for the peripheral electrodes 41b and 42b that are connected to the peripheral electrodes 40 formed in each element substrate 10 through the routing wiring 41a and 42a, and the plurality of liquid crystal devices 100 are configured collectively such that ionic impurities do not spread, it is possible to enclose liquid crystal between the pair of substrates 10 and 20 while suppressing the spread of ionic impurities in a mother substrate 500 state. As a result of this, it is possible to improve productivity.

(3) According to the method for producing the liquid crystal device 100 of the first embodiment, it is possible to create a transverse electric field by forming the first peripheral electrode 41 and the second peripheral electrode 42 to which different potentials are applied in the outer periphery of the pixel region E. Accordingly, it is possible to suppress the spread of ionic impurities to the pixel region E from the sealing materials 14 which are exuded as a result of coming into contact with liquid crystal.

(4) According to the method for producing the liquid crystal device 100 of the first embodiment, since pixel electrode 27 and the peripheral electrode 40 are formed on the element substrate 10 side, it is possible to form a novel technique for forming the peripheral electrode 40 without adding production steps. More specifically, there is a photolithography step for forming the pixel electrode 27, but it is possible to create the peripheral electrode 40 using this step. Accordingly, it is possible to suppress the cost and production requirements thereof.

(5) According to the mother substrate 501 of the first embodiment, since each peripheral electrode 40 of the plurality of element substrates 10 is provided, it is even possible to suppress the spread of ionic impurities to the pixel region E as a result of the peripheral electrode 40 in a case in which ionic impurities are included in the liquid crystal or ionic impurities are brought in together with the liquid crystal by applying a voltage to the external terminals for the peripheral electrodes 41b and 42b at the time of dripping liquid crystal. In addition, since a plurality of element substrates 10 are imposed on the element side of the mother substrate 501, and the external terminals for the peripheral electrodes 41b and 42b are connected to the peripheral electrodes 40 formed on each element substrate 10 are connected through the routing wiring 41a and 42b, it is possible to configure such that ionic impurities do not spread to the pixel region E by applying a voltage to the external terminals for the peripheral electrodes 41b and 42b. In other words, it is possible to enclose liquid crystal between the pair of substrates 10 and 20 while suppressing the spread of ionic impurities in a mother substrate 501 state. As a result of this, it is possible to improve productivity.

Second Embodiment

Substrate for Electro-Optical Device

Figure 10:
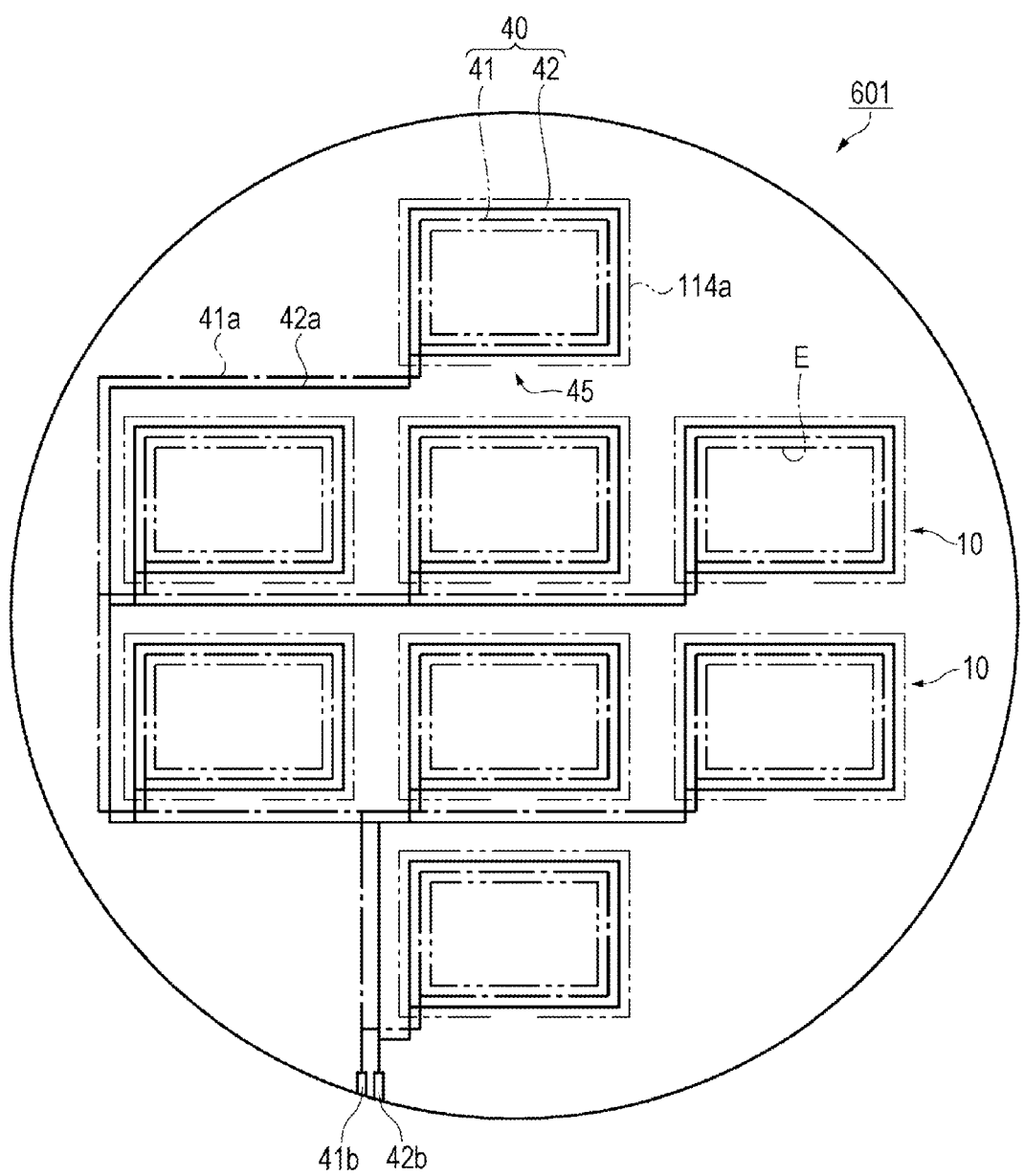
FIG. 10 is a schematic plan view that shows the configuration of a mother substrate of an injection method of a second embodiment.

FIG. 10 is a schematic plan view that shows the configuration of a mother substrate (first substrate) as a substrate for an electro-optical device of an injection method of a second embodiment. Hereinafter, the configuration of the mother substrate of the second embodiment will be described with reference to FIG. 10.

A mother substrate 601 of the second embodiment differs from the mother substrate 501 of the first embodiment that was described above in that the mother substrate 601 is produced using a liquid crystal injection method rather than a liquid crystal dripping method, and the rest of the configuration thereof is generally the same. For this reason, in the second embodiment portions that differ from the first embodiment will be described in detail and the descriptions of other portions that overlap will be omitted as appropriate.

As shown in FIG. 10, a plurality of element substrates 10 are imposed in the manner described above on the element side of the mother substrate 601 of the second embodiment. A first peripheral electrode 41 and a second peripheral electrode 42, which is disposed at the perimeter of the first peripheral electrode 41, that configure a pair of peripheral electrodes 40 are disposed at the perimeter of a pixel region E.

In addition, the perimeter of the pair of peripheral electrodes 40 has sealing definition regions 114a which are regions that define the sealing materials 14. Since liquid crystal is enclosed using an injection method in a liquid crystal device 200 of the second embodiment, the sealing definition regions 114a are formed with the exception of a region that forms liquid crystal injection inlets 45 (a portion thereof is open). The pair of peripheral electrodes 40 provided in the same layer as the pixel electrode 27 (refer to FIG. 6) in the same manner as the first embodiment.

The first peripheral electrode 41 in the plurality of element substrates 10 is electrically connected to all of the first peripheral electrodes 41 through routing wiring 41a. The routing wiring 41a is electrically connected to an external terminal 41b for the first peripheral electrode that is provided in a portion of the element side of the mother substrate 601.

In addition, the second peripheral electrode 42 in the plurality of element substrates 10 is electrically connected to all of the second peripheral electrodes 42 through routing wiring 42a. The routing wiring 42a is electrically connected to an external terminal 42b for the second peripheral electrode that is provided in a portion of the element side of the mother substrate 601.

That is, as a result of different voltages being applied to the external terminal 41b for the first peripheral electrode and the external terminal 42b for the second peripheral electrode, it becomes possible to generate a difference in potential at the perimeter of the pixel region E in the plurality of element substrates 10, and it is even possible to suppress the spread of impurities to the pixel region E as a result of the peripheral electrode 40 in a case in which impurities are included in the liquid crystal that is injected into the area that is surrounded by the sealing materials 14 or impurities are brought in together with the liquid crystal in the production process.

In addition, since a voltage is applied collectively to a plurality of element substrates 10 by the routing wiring 41a and 42a, it is possible to enclose liquid crystal between the pair of substrates 10 and 20 while suppressing the spread of ionic impurities in a large (mother substrate) state. As a result of this, it is possible to improve productivity.

Method for Producing Electro-Optical Device (Method for Producing Mother Substrate (Liquid Crystal Device))

FIG. 11 is a flowchart that shows the order of the processes of a method for producing a liquid crystal device. Hereinafter a method for producing a liquid crystal device will described with reference to FIG. 11. Additionally, in the same manner as the first embodiment, a method for producing a single liquid crystal device 200 will be described, but effectively, the method forms a plurality of liquid crystal devices 200 simultaneously using the mother substrate.

Steps S11 to S13 and Steps S21 and S22 are the same as the first embodiment. Additionally, the step of preparing the element substrate 10 (element side of the mother substrate 601) is set as an eleventh step. The step of preparing the opposing substrate 20 (opposing side of the mother substrate) is set as a twelfth step. Hereinafter, a method for bonding the element substrate 10 and the opposing substrate 20 together will be described.

In Step S31 (step 13), the sealing materials 14 are coated onto the sealing definition regions 114a on the element side of the mother substrate 601 (element substrate 10). In more detail, the sealing materials 14 are coated onto a peripheral border section (so as to surround the pixel region E with the exception of the liquid crystal injection inlets 45) of the pixel region E in the mother substrate 601 by changing the relative positional relationship between the mother substrate 601 and a dispenser (a discharge device is possible).

In Step S132 (step 14), the element substrate 10 and the opposing substrate 20 are bonded together. More specifically, the element substrate 10 and the opposing substrate 20 are bonded together through the sealing materials 14 coated on the element substrate 10 (element side of the mother substrate 601). Even more specifically, the process is performed while maintaining the positional accuracy of the mutual planar vertical direction and horizontal direction of the substrates 10 and 20.

In Step S133 (step 15) hardening of the sealing materials 14 and voltage application to the peripheral electrode 40 is performed. More specifically, as the method for hardening the sealing materials 14, for example, heating can be used if the sealing materials 14 are thermosetting resins or the irradiation of ultraviolet light can be used if the sealing materials 14 are ultraviolet curable resins.

In addition, a voltage is applied to the first peripheral electrode 41 and the second peripheral electrode 42. More specifically, a voltage is applied to respective first peripheral electrodes 41 through the external terminal 41b for the first peripheral electrode and the routing wiring 41a. A direct current of for example, 0 V is applied to the first peripheral electrode 41.

In addition, a voltage is applied to respective second peripheral electrodes 42 through the external terminal 42b for the second peripheral electrode and the routing wiring 42a. A direct current of for example, −5 V is applied to the second peripheral electrode 42 that is disposed outside the first peripheral electrode 41.

In Step S134 (step 16), liquid crystal is injected inside the structure from the liquid crystal injection inlets 45 (refer to FIG. 10), and thereafter, the liquid crystal injection inlets 45 are sealed. The sealing uses a sealing material such as a resin for example.

In Step S135, the pair of mother substrates are cut. More specifically, the pair of mother substrate 500 that have been bonded together are cut along a scribe line in units of liquid crystal devices 200, and individual liquid crystal devices 200 are completed.

As described above, according to the method for producing the liquid crystal device 200 of the second embodiment and the mother substrate 601, it is possible to obtain the effects indicated below in addition to the effects of the abovementioned (2) to (4).

(6) According to the method for producing the liquid crystal device 200 of the second embodiment, since a voltage is applied to the peripheral electrode 40 at the time of hardening the sealing materials 14, it is even possible to suppress the spread of ionic impurities to the inside of the pixel region E in a case in which ionic impurities are included in the injected liquid crystal or ionic impurities are brought in together with the liquid crystal. In addition, since a plurality of element substrates 10 are imposed on the element side of the mother substrate 601, a voltage is applied to the external terminals for the peripheral electrodes 41b and 42b that are connected to the peripheral electrodes 40 formed in each element substrate 10 through the routing wiring 41a and 42a, and the liquid crystal device 200 are configured collectively such that ionic impurities do not spread, it is possible to enclose liquid crystal between the pair of substrates 10 and 20 while suppressing the spread of ionic impurities in a mother substrate 601 state. As a result of this, it is possible to improve productivity.

(7) According to the mother substrate 601 of the second embodiment, since each peripheral electrode 40 of the plurality of element substrates 10 is provided, it is even possible to suppress the spread of ionic impurities to the pixel region E in a case in which ionic impurities are included in the liquid crystal or ionic impurities are brought in together with the liquid crystal by applying a voltage to the external terminals for the peripheral electrodes 41b and 42b at the time of injecting liquid crystal. In addition, since a plurality of element substrates 10 are imposed on the element side of the mother substrate 601, and the external terminals for the peripheral electrodes 41b and 42b are connected to the peripheral electrodes 40 formed on each element substrate 10 are connected through the routing wiring 41a and 42a, it is possible to enclose liquid crystal between the pair of substrates 10 and 20 while suppressing the spread of ionic impurities in a mother substrate 601 state since the device is configured so that ionic impurities do not spread by applying a voltage to the external terminals for the peripheral electrodes 41b and 42b. As a result of this, it is possible to improve productivity.

Additionally, the aspects of the present invention are not limited to the abovementioned embodiments, and can be changed as appropriate within a range that does not depart from the scope or the idea of the invention that can be understood from the claims and the entirety of the specification, and is included in the technical range of the aspect of the present invention. In addition, the invention can be implemented in the following forms.

Modification Example 1

In the manner described above, the timing of the application of voltage to the pair of peripheral electrodes 40 in the method for producing the liquid crystal device 100 of the ODF method is performed together with the dripping of liquid crystal in Step S32, but the application is not limited thereto, and for example, may be performed between Step S32 and Step S33 or together with the timing of the hardening of the sealing materials 14 in Step S33. Additionally, in the ODF method, it is preferable that a voltage be applied to the pair of peripheral electrodes 40 before unhardened sealing materials 14 come into contact with the liquid crystal (before bonding together of the substrates).

In addition, the timing of the application of voltage to the pair of peripheral electrodes 40 in the method for producing the liquid crystal device 200 of the injection method is performed together with the hardening of the sealing materials 14 in Step S133, but the application is not limited thereto, and for example, may be performed between Step S133 and Step S134 or together with the timing of the injection of the liquid crystal. Additionally, in the injection method, it is preferable that a voltage be applied to the pair of peripheral electrodes 40 before unhardened sealing materials 14 come into contact with the liquid crystal (before injection).

Modification Example 2

The provision of the pair of peripheral electrodes 40 (the first peripheral electrode 41 and the second peripheral electrode 42) is not limited to the element substrate 10 side in the manner described above, and for example, one peripheral electrode 40 may be respectively provided on the element substrate 10 side and the opposing substrate 20 side. More specifically, for example, the second peripheral electrode 42 may be provided on the element substrate 10 side and the first peripheral electrode 41 on the opposing substrate 20 side. The common electrode 31 may be used as the first peripheral electrode 41. In such a case, the spread of ionic impurities is prevented by creating a vertical electric field between the second peripheral electrode 42 and the common electrode 31.

In addition, the provision of the peripheral electrode 40 is not limited to the element substrate 10 side, and the peripheral electrode 40 may be provided on the opposing substrate 20 side. Additionally, due to the facts that the voltage is applied from the element substrate 10 side, there is not a photolithography step on the opposing substrate 20 and the like, and that there is a concern that there will be an increase in cost, it is preferable that the peripheral electrode 40 be formed on the element substrate 10 side.

Modification Example 3

The application of a voltage is not limited to 0 V to the first peripheral electrode 41 and a voltage of −5 V to the second peripheral electrode 42 in the manner described above, and for example, the voltage of the second peripheral electrode 42 may be larger (on the −6 V side). According to this configuration, it is possible to improve the ion trapping effect.

Modification Example 4

The pair of peripheral electrodes 40 are not limited to being used in the process of enclosing the liquid crystal only in the manner described above, and for example, the pair of peripheral electrodes 40 may be used at the time of driving the liquid crystal device 100 (during lighting of a panel). Additionally, it is preferable that voltages of 0 V and −5 V be applied to the pair of peripheral electrode 40 so that the voltages at the time of driving the liquid crystal device 100 are not higher than the voltages applied during production. In addition, in a case in which the pair of peripheral electrodes 40 is used during driving, it is preferable that a terminal that is electrically connected to the pair of peripheral electrodes 41 and 42 be provided in the terminal for external connections 61.

Modification Example 5

The liquid crystal device 100 is not limited to a transmissive type in the manner described above, and may be a reflective type. In a case of a reflective type, as the material of peripheral electrode 40, for example, a metal film that has a similar reflectivity to the pixel electrode is used. As the reflective metal film, for example, aluminum may be used.

Modification Example 6

The abovementioned electro-optical device is not limited to being the liquid crystal device 100, and for example, can use an organic EL (Electroluminescence) device, an electrophoretic device or the like.

Modification Example 7

Use of the liquid crystal device 100 is not limited to a projection type display device in the manner described above, and for example, the liquid crystal device 200 can be used in a variety of electronic apparatuses such as a smartphone, a mobile telephone, a head-mounted display, an EVF (Electrical View Finder), a small projector, a mobile computer, a digital camera, a digital video camera, a display, an in-vehicle apparatus, an audio apparatus, an exposure device or an illumination device.

This application claims priority from Japanese Patent Application No. 2012-107354 filed in the Japanese Patent Office on May 9, 2012, the entire disclosure of which is hereby incorporated by reference in its entirely.

What is claimed is:

1. A method for producing a substrate for an electro-optical device, comprising:
   providing a first substrate that has a plurality of substrates for an electro-optical device, a wiring and a collective terminal, each of the plurality of substrates for an electro-optical device having a display region, a terminal and a first electrode which is electrically connected to the terminal, the wiring electrically connecting the collective terminal to the first electrode of each of the plurality of substrates for an electro-optical device,
   forming a plurality of sealing materials on at least one side of the first substrate, each of the plurality of sealing materials surrounding both of the display region of each of the plurality of substrates for an electro-optical device and the first electrode of each of the plurality of substrates for an electro-optical device, and a second substrate that is disposed facing the first substrate;
   supplying an electro-optical substance to regions that are encompassed by the plurality of sealing materials;
   bonding the first substrate and the second substrate;
   hardening the sealing materials; and
   cutting the first substrate and the second substrate,
   wherein a predetermined potential is applied to the collective terminal in the processes from the supplying to the hardening, and the wiring is divided in the process of the cutting.

2. The method for producing a substrate for an electro-optical device according to claim 1,
   wherein each of the plurality of substrates for an electro-optical device has a second electrode which is surrounded by one of the plurality of sealing materials, and wherein different potentials are applied to the first electrode and the second electrode.

3. The method for producing a substrate for an electro-optical device according to claim 1, further comprising:
   forming an alignment film in the first substrate and the second substrate,
   wherein the alignment film is an inorganic oblique deposition film.

4. The method for producing a substrate for an electro-optical device according to claim 1,
   wherein each of the plurality of substrates for an electro-optical device has a pixel electrode in the display region.

5. A method for producing a substrate for an electro-optical device, comprising:
   providing a first substrate that has a plurality of substrates for an electro-optical device, a wiring and a collective terminal, each of the plurality of substrates for an electro-optical device having a display region, a terminal and an first electrode which is electrically connected to the terminal, the wiring electrically connecting the collective terminal to the first electrode of each of the plurality of substrates for an electro-optical device,
   forming a plurality of sealing materials on at least one side of the first substrate, so as to have an injection inlet respectively, each of the plurality of sealing materials surrounding both of the display region of each of the plurality of substrates for an electro-optical device and the first electrode of each of the plurality of substrates for an electro-optical device, and a second substrate that is disposed facing the first substrate;
   bonding the first substrate and the second substrate together;
   hardening the sealing materials;
   injecting the electro-optical substance into each region that is encompassed by the sealing materials;
   sealing the injection inlet of each of the plurality of sealing materials; and
   cutting the first substrate and the second substrate,
   wherein a predetermined potential is applied to the collective terminal in the processes from the injecting to the sealing, and the wiring is divided in the process of the cutting.

6. The method for producing a substrate for an electro-optical device according to claim 5,
   wherein each of the plurality of substrates for an electro-optical device has a second electrode which is surrounded by one of the plurality of sealing materials,
   wherein different potentials are applied to the first electrode and the second electrode.

7. The method for producing a substrate for an electro-optical device according to claim 5, further comprising:
   forming an alignment film in the first substrate and the second substrate,
   wherein the alignment film is an inorganic oblique deposition film.

8. The method for producing a substrate for an electro-optical device according to claim 1, wherein the predetermined potential is applied to the collective terminal during the acts of supplying the electro-optical substance, bonding the first substrate and second substrate, and hardening the sealing materials.

9. The method for producing a substrate for an electro-optical device according to claim 5, wherein the predetermined potential is applied to the collective terminal during the acts of hardening the sealing materials and injecting the electro-optical substance.

* * * * *